United States Patent [19]
Gravisse

[11] 4,088,508
[45] May 9, 1978

[54] AMPLIFYING DEVICE OF RADIANT ENERGY

[76] Inventor: Philippe Edouard Gravisse, 9, Residence Boieldieu, Puteaux, France, 92800

[21] Appl. No.: 783,043

[22] Filed: Mar. 30, 1977

[30] Foreign Application Priority Data

Mar. 31, 1976 France ............................... 76 09321

[51] Int. Cl.$^2$ .......................................... H01L 31/04
[52] U.S. Cl. ......................... 136/89 HY; 250/211 R; 250/213 R; 250/216; 250/367; 250/486; 252/301.17; 252/301.35
[58] Field of Search .............. 136/89 HY; 252/301.17; 250/458, 361, 363 R, 367, 211 R, 213 R, 486, 216

[56] References Cited

U.S. PATENT DOCUMENTS

| | | |
|---|---|---|
| 3,309,226 | 3/1967 | Weisbeck et al. .................... 117/201 |
| 3,426,212 | 2/1969 | Klaas .................................... 250/226 |
| 3,591,420 | 7/1971 | Streed ................................... 136/89 |
| 3,912,931 | 10/1975 | Gravisse et al. ..................... 250/458 |
| 3,929,510 | 12/1975 | Kittl .................................. 136/89 X |

FOREIGN PATENT DOCUMENTS

2,246,078   1975   France.

OTHER PUBLICATIONS

B. Dale, "Research on Efficient Photovoltaic Solar Energy Converters," Final Report, Contract AF19 (604)-5585, Jun. 1960, pp. 31-33.

Primary Examiner—Aaron Weisstuch
Attorney, Agent, or Firm—Staas & Halsey

[57] ABSTRACT

A radiant energy amplifying device receiving energies from short wavelengths by a plurality of scintillating materials having high quantum yields operting in cascade which are distributed homogeneously in a matrix made of synthetic resinous material whose absorption threshold is at a wavelength less than the absorption zone of the scintillating material located at the beginning of the cascade, wherein the scintillating materials are present in the matrix in a proportion varying according to the material from $2 \times 10^{-3}$ to $10^{-7}$ mole/kg of resin, the highest concentration corresponding to the material being located at the beginning of the cascade.

10 Claims, 5 Drawing Figures

AMPLIFYING DEVICE OF RADIANT ENERGY

The present invention relates to a novel radiant energy amplifier device.

This device results from various improvements made in the photovoltaic device described and claimed in French patent application No. 73, 21890 published under French Pat. No. 2,246,078 (Equivalent to U.S. Pat. No. 3,912,931).

In the latter, the photovoltaic device is made up of a photovoltaic cell of the large surface junction diode type, covered with a plurality of layers placed on one another and made of a material transparent to the sensitivity spectrum of the photovoltaic cell, said material preferably being a silicone resin. This device is particularly remarkable in that each layer contains an aromatic hydrocarbon able to recover the energy coming from the preceding layer and to transmit it to the following layer, the photovoltaic cell thus cumulatively receiving the energies of the various layers.

Such a device therefore has a laminated structure, each sheet, or layer, comprising an aromatic hydrocarbon.

A first improvement according to the present invention has consisted in replacing this laminated structure with a homogeneous structure, this replacement being due to the following reasons.

Take the case of a photovoltaic cell on which are arranged four layers each respectively containing, as described in French Pat. No. 2,246,078, hydrocarbon A, B, C, D; hydrocarbon A absorbing in the short wavelengths and reemitting in a larger wavelength zone, which corresponds to the absorption of hydrocarbon B, which process is repeated for the other layers. Hydrocarbon D, thus recovers the various energies transmitted by hydrocarbons A, B, C, and reemits this overall energy in a region of the spectrum where the photovoltaic cell is sensitive.

The probability that a photon will go in the direction of the photovoltaic cell or in the opposite direction can be estimated at 50%. This means that a photon coming from D has a 50% chance of reaching the photovoltaic cell, from C a 50% chance of reaching D, from B a 50% chance of reaching C, from A a 50% chance of reaching B.

Consequently, by calculating the probability $p$ for a photon coming from A, B, C, D actually reaching the photovoltaic cell, we have the following results:

A→photovoltaic cell : $p = 0.0625$
B→photvoltaic cell : $p = 0.125$
C→photovoltaic cell : $p = 0.25$
D→photovoltaic cell : $p = 0.5$ It appears from these figures that the efficiency of the photovoltaic cell will be measurably improved by transfer of energy coming from the shorter wavelengths, primarily from layers C and D.

Quite obviously, the energies of the very short wavelengths, corresponding to the absorption and emission zones of layers A and B will not reach the photovoltaic cell, hence a loss of gain in efficiency.

This major drawback no longer exists in the present device where the various photons emitted all have practically the same probability of reaching the photovoltaic cell.

Further, the present device is distinguished from certain photocells containing fluorescent dyes which act as a filter, and increase the sensitivity for a given band, particularly blue, to the detriment of the overall efficiency of the photovoltaic cell.

More precisely, the radiant energy amplifying device, object of the present invention, particularly suitable as a photovoltaic cell or other pickup, which cumulatively receives energies coming from short wavelengths by means of a plurality of scintillating materials with high quantum yield operating in cascade, i.e., wherein the absorption spectrum of one of the scintillating materials overlaps the emission spectrum of the other scintillating material, except for the material that is at the beginning of the cascade toward the shortest wavelengths, is particularly remarkable in that said scintillating materials, which are distributed homogeneously in a matrix made of synthetic material whose absorption threshold is located at a wavelength less than the absorption zone of the scintillating material located at the beginning of the cascade, are present in said matrix in a proportion varying, according to the material, from $2 \times 10^{-3}$ to $10^{-7}$ mole/kg of resin, the highest concentration corresponding to said material located at the beginning of the cascade.

According to an embodiment of the invention, the emission spectrum of the scintillating material placed at the end of the cascade, toward the longer wavelengths, corresponds to the maximal sensitivity zone of the photovoltaic cell.

Preferably, the resins used for said matrix are based on silicones or PMMA (polymethylmethacrylate), not treated against UV.

Other advantages and characteristics will be brought out better from a reading of the description which is given with reference to the figures given by way of indication and in no way limiting, of which:

FIG. 1 schematically represents a usual photovoltaic cell;

Figure 4:
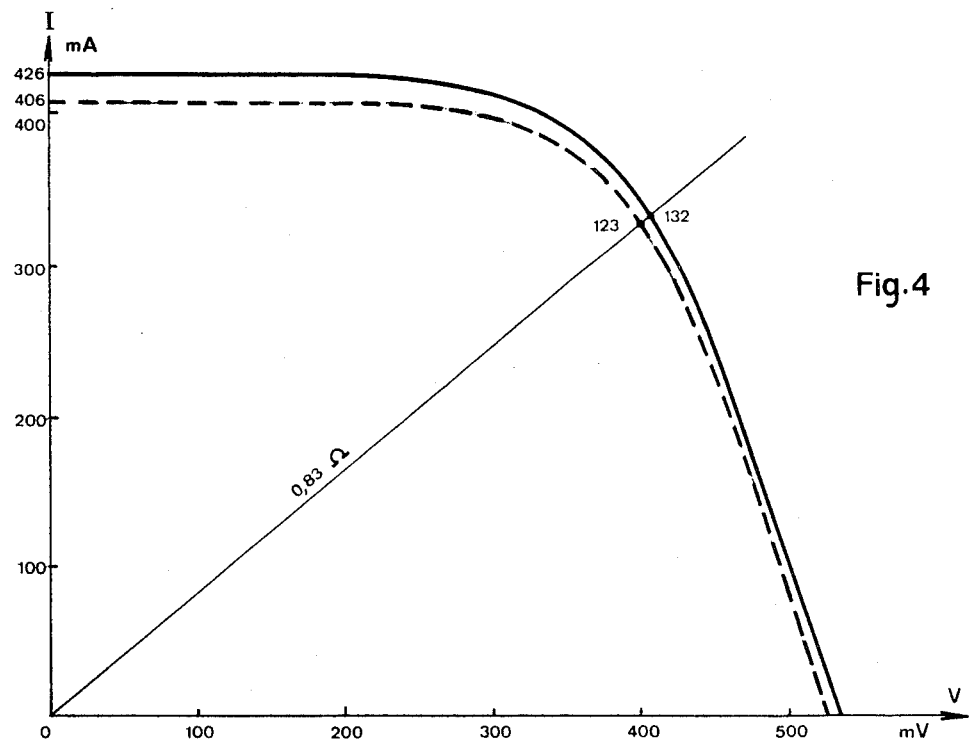
Figure 5:
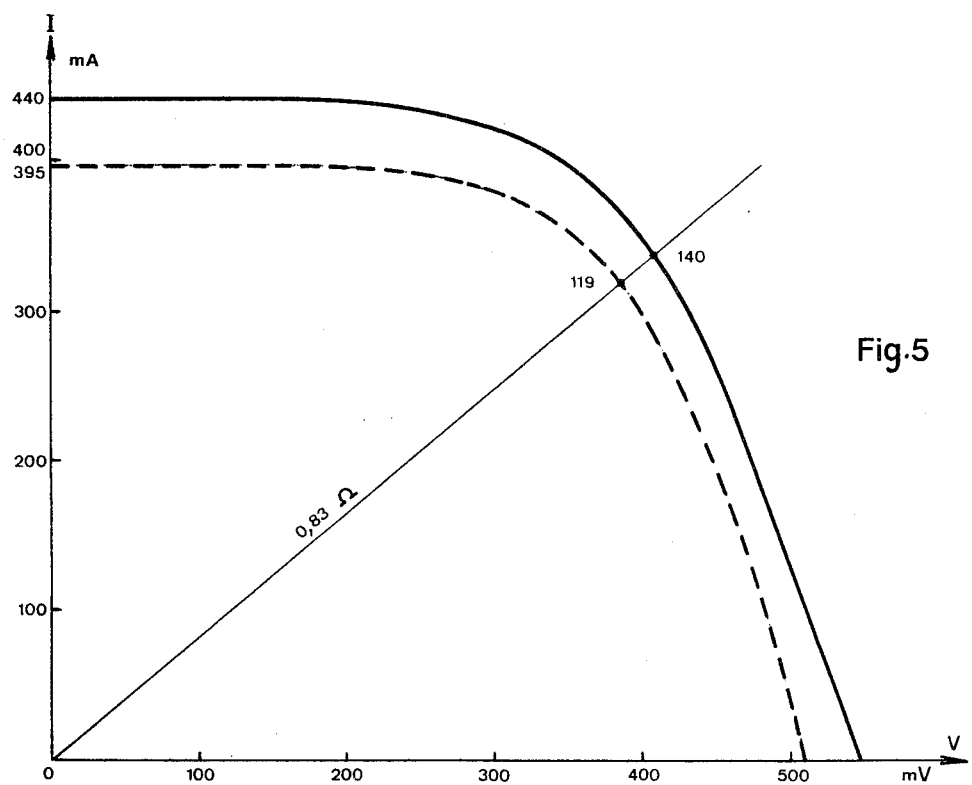

FIG. 4 illustrates the curves of the current as a function of the voltage, for a usual photovoltaic cell with glass (curve in broken lines) and for the same photovoltaic cell without glass, with synthetic matrix with two scintillating materials (solid line curve); and FIG. 5 illustrates the curves of the current as a function of the voltage, for the usual photovoltaic cell with glass (dotted line curve) and for the same photovoltaic cell without glass, with a synthetic matrix having three scintillating materials (solid line curve).

Figure 1:
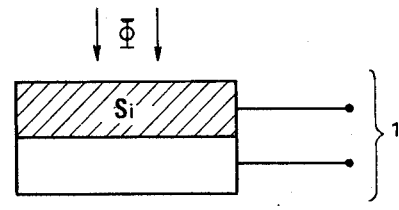

As seen in FIG. 1, a standard photovoltaic cell 1, comprises, for example, a layer of silicon (Si), the latter preferably being sensitive to photons $\Phi$ or wavelengths between 7,000 and 8,000 Å, or of CdS or CdTe.

Figure 2:
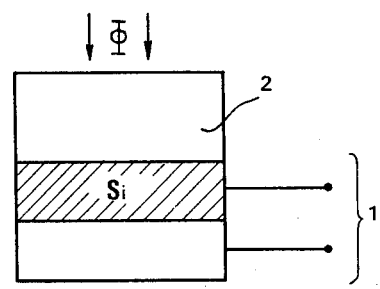
FIG. 2 is a view in section of an amplifying device according to the present invention, adapted to the photovoltaic cell of FIG. 1.

The device illustrated in FIG. 2 makes it possible to very considerably increase the overall efficiency of the photovoltaic cell 1 of FIG. 1, thanks to a matrix 2 made of synthetic material and containing various scintillating materials homogeneously dispersed in said matrix, said materials being selected so that the absorption spectrum of one of the materials overlaps the emission spectrum of another scintillating material, except for the material placed at the head of the cascade, i.e., toward the shortest wavelenghts.

Figure 3:
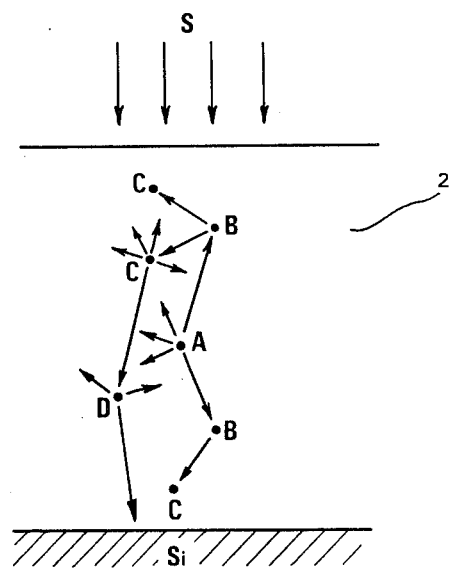
FIG. 3 is a diagram of the phenomena occurring in the matrix of synthetic material.

FIG. 3 gives a better understanding of the phenomena that occur inside matrix 2 where scintillating materials A, B, C, D are dispersed, the arrows designating certain possibilities of the paths of the photons. Emission of A, for example, is picked up and absorbed by molecules B located either between A and the photovoltaic cell or between A and the source of external radiation S. It is the same for the emissions of B, C, and D.

Thus, statistically, half the photons of greater wavelength (7,000-8,000 A) are directed toward the photovoltaic cell, and half in the opposite direction; actually, the photons emitted in the plane parallel to the matrix-Si interface are negligible.

It will be easily understood then that the efficiency obtained by the matrix photovoltaic cell is much greater than that of the device with laminated structure, where the various photons were subjected to reflections at the interfaces of the various layers located on the photovoltaic cell. Actually, the probability that a photon coming from A will reach the photovoltaic cell is on the order of 0.5 whereas it is only 0.0625 in the laminated structure; the photovoltaic cell will thus recover a greater amount of energy coming from a plurality of energies absorbed and then reemitted by the various scintillating materials. The process may start from short wavelengths; for example, benzene, which can be one of said scintillating materials, absorbing between 2000 A and 3000 A, with a maximum of 2700 A.

It is quite obvious that the matrix containing the scintillating materials should exhibit certain properties and particularly should be transparent to the spectrum of sensitivity of the photovoltaic celll and and the various scintillating materials. In particular, care must be taken that the absorption threshold of the matrix occur at a wavelength less than the absorption zone of material A, if the cascade A→B→C→D→photovoltaic cell is considered.

By way of example, this threshold is 3700 A for anti UV treated PMMA resin, 3150 A for glass, 2700 A for silicone resins. The last value is particularly advantageous, which causes silicone resins to be selected as the material for making said matrix.

Another good class of resins is that of untreated anti UV PMMA (polymethylmethacrylate).

It is well to dwell more particularly on the latter resins which exhibit an emission spectrum showing two peaks, a high one around 3550 A, which corresponds approximately to the absorption zone of anthracene, which can be one of the scintillating materials, and the other, of lesser intensity but more spread out, located between 4500 A and 5500 A, the absorption zone of pentacene, another usable scintillating material.

To achieve the best results, it is essential that the various scintillating materials be distributed as homogeneously as possible in the matrix.

Another phenomenon affecting the efficiency of the photovoltaic cell is the concentration of the scintillating materials necessary to obtain the maximum chances of having the photons reach the photovoltaic cell.

It has been found that a concentration of $2 \times 10^3$ to $10^{-7}$ mole per kilogram of resin is entirely satisfactory, a concentration greater than this range ending in a coloring of the matrix, hence causing a filter phenomenon lowering the overall efficiency of the photvoltaic cell by reflecting certain wavelengths. Preferably, the highest concentration is that of the material placed at the head of the cascade, i.e. toward the shortest wavelengths.

Of the usable scintillating materials there can be cited: aromatic hydrocarbons of the benzene series (benzene, naphthelene, anthracene, naphthacene, pentacene), uranine, rhodamine B (absorption threshold 5500 A, emission 5500-7000 A), fluorescein, α-naphthol, diphenyloxazol (PPO), p-phenylene bis 2,2'-(phenyl 5 oxazole) or its dimethyl compound.

Examples will now be given, where the device according to the invention is adapted to an RTC type photovoltaic cell, reference BP × 47 A with a sensitive surface equal to 24 cm², with a silicon base.

EXAMPLE I (FIG. 4, broken lines)

This refers to a photovoltaic cell of above said type, standardly treated for antireflection and covered with a glass sheet. Shown is the curve of the current as a function of the voltage, at an illumination of 1 kW/m² (with a spectrum close to that of the sun):
short circuit current: 406 m A
open circuit voltage: 520 m V
power at the optimal operating point (optimal charge resistance: 0.83Ω): 123 m W.

EXAMPLE II (FIG. 4, solid line)

The same photovoltaic cell is used as that of example I, however, it is not provided with a sheet of glass, but is covered with a matrix of untreated anti UV PMMA, 3 mm thick and containing $2.10^{-4}$ mole/kg resin, of uranine and $2.10^{-5}$ mole/kg of resin, of rhodamine B, which gives the following characteristics under the same illumination conditions:
short circuit current: 426 mA, or a gain of 4.9%
open circuit current: 530 mV
power at optimal operating point : 132 m W, or a gain of 7.3%

EXAMPLE III (FIG. 5, dotted line)

Another photovoltaic cell, similar to that of example I provided:
short circuit current: 395 mA
open circuit voltage: 510 mV
power at optimal operating point: 119 mW EXAMPLE IV (FIG. 5, solid line)

The photovoltaic cell of example III, not provided with glass but provided with a matrix 3 mm thick, made of untreated anti UV PMMA, in which are dispersed:
$2.10^{-3}$ mole/kg of resin, of PPO
$2.10^{-4}$ mole/kg of resin, of uranine
$2.10^{-5}$ mole/kg of resin, of rhodamine B
The following characteristics are obtained:
short circuit current: 440 mA, or a gain of 11.4%
open circuit voltage: 545 mV
power at optimal operating point: 140 mW, or a gain of 17.6%.

The above examples show that the gains are obtained both in the level of the short circuit current and the power at optimal operating point, especially for the photovoltaic cell of example IV.

Further, it should be noted that the thickness of the matrix is 3 mm, i.e., this matrix, besides the support function for the scintillating materials will have the function of protecting the photovoltaic cell.

The present invention is also further distinguished from known devices where the thickness of the synthetic layers covering the photovoltaic cells hardly exceeds 100 μ.

Precisely because of this great thickness (several millimeters) the energy amplifying device according to the present invention can be used alone and may constitute, for example, the transparent walls of a hothouse whose reemission of the photons (energy) in the specific photosynthesis bands (4300-4400 A, 6500 A) is favored so as to improve the yield of plants grown in hothouses of said type.

It is also possible to adapt said amplifying device (matrix + scintillating material) to a heliothermic pickup, the matrix being treated so as to mobilize at the level of the wavelength band of the optimal yield of the black body a number of photons greater than those present in the wavelength considered. The calorific energy generated by such pickups being a function of $h\gamma$, if $h\gamma$ increases, the number of calories generated will increase in the same proportion.

Various other applications are, of course, possible by using the device according to the invention, which can also function as a solar photovoltaic cell by addition to the matrix of a photovoltaic cell of the type illustrated in FIG. 1.

In this latter case, it should be noted that the photovoltaic cell provided with the matrix charged with scintillating materials will have the advantage of not having an anti-reflection treatment. Therefore, it has a black appearance, which means that all the incident radiation can be picked up by the photovoltaic cell: it is different from standard photovoltaic cells which are is anti-reflection treated, and thus have a bluish appearance, which means that the energy band corresponding to wavelengths in the blue region will not be picked up by the photovoltaic cell, hence an efficiency loss.

Another advantage of the device according to the invention, applied to a photovoltaic cell with black appearance, therefore not anti-reflection treated, is that it permits the reuse of the photons reflected by the sensitive surface of the photovoltaic cell by retransforming them into useful photons thanks to the scintillating materials, said useful photons being statistically sent toward the photovoltaic cell.

I claim:

1. A radiant energy amplifying device, particularly suitable for a photovoltaic cell or other pickup, which cumulatively receives energies coming from short wavelengths by a plurality of scintillating materials with high quantum yield operating in cascade wherein the absorption spectrum of one of the scintillating materials overlaps the emission spectrum of the other scintillating material, except for the material that is at the beginning of the cascade, absorbing toward the shortest wavelengths, characterized in that said scintillating materials, which are distributed homogeneously in a matrix made of solid synthetic polymeric material whose absorption threshold is at a wavelength less than the absorption zone of the scintillating material located at the beginning of the cascade, are present in said matrix in a proportion varying, according to the material, from $2 \times 10^{-3}$ to $10^{-7}$ mole/kg of resin, the highest concentration corresponding to said material located at the beginning of the cascade.

2. Amplifying device according to claim 1, in combination with a photovoltaic cell underlying said device, characterized in that the emission spectrum of the scintillating material placed at the end of the cascade, toward the longest wavelengths, corresponds to the maximal sensitivity zone of the photovoltaic cell.

3. Amplifying device according to claim 1 characterized in that at least one of said scintillating materials is selected from the group: benzene, naphthalene, anthracene, naphthacene, pentacene.

4. Amplifying device according to claim 1 characterized in that at least one of said scintillating materials is selected from the group: α-naphthol, diphenyloxazole, uranine, fluorescein, rhodamine B, p phenylene bis 2,2'-(phenyl 5 oxazole), dimethyl-p-phenylene bis 2,2'-(phenyl 5 oxazole).

5. Amplifying device according to claim 1 characterized in that said matrix is made of silicone.

6. Amplifying device according to claim 1 characterized in that said matrix is made of untreated anti UV polymethylmethacrylate.

7. Amplifying device according to claim 1 characterized in that said matrix has a thickness of 3 mm.

8. Amplifying device according to claim 1 characterized in that the matrix, 3 mm thick, of untreated anti UV polymethylmethacrylate comprises a homogeneous dispersion comprising:

$2 \times 10^{-4}$ mole/kg of resin, of uranine; and
$2 \times 10^{-5}$ mole/kg of resin, of rhodamine B.

9. Amplifying device according to claim 8 characterized in that said matrix further comprises $2 \times 10^{-3}$ mole/kg of resin, of diphenyloxazole.

10. Amplifying device according to claim 1 characterized in that it is overlying an Si type, non anti-reflection, treated photovoltaic cell.

* * * * *